US011237591B2

(12) United States Patent
Urimoto

(10) Patent No.: US 11,237,591 B2
(45) Date of Patent: Feb. 1, 2022

(54) ELECTRONIC DEVICE

(71) Applicant: Panasonic Intellectual Property Management Co., Ltd., Osaka (JP)

(72) Inventor: Tetsuya Urimoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/532,656

(22) Filed: Aug. 6, 2019

(65) Prior Publication Data

US 2019/0361492 A1 Nov. 28, 2019

Related U.S. Application Data

(63) Continuation of application No. PCT/JP2018/005676, filed on Feb. 19, 2018.

(30) Foreign Application Priority Data

Feb. 24, 2017 (JP) .............................. JP2017-033124

(51) Int. Cl.
   *G06F 1/16* (2006.01)
   *H05K 5/00* (2006.01)
   (Continued)

(52) U.S. Cl.
   CPC ............ *G06F 1/1616* (2013.01); *E05B 63/24* (2013.01); *E05B 65/006* (2013.01); *G06F 1/1679* (2013.01); *H05K 5/03* (2013.01)

(58) Field of Classification Search
   CPC ........ G06F 1/1616; G06F 1/1679; G06F 1/16; H05K 5/03; E05B 65/006; E05B 63/24
   See application file for complete search history.

(56) References Cited

U.S. PATENT DOCUMENTS 6,890,008 B1 * 5/2005 Chuang ..................... E05C 3/14
                                                    292/121
6,965,512 B2 * 11/2005 Huang ..................... G06F 1/162
                                                    292/251.5

(Continued)

FOREIGN PATENT DOCUMENTS

| JP | 62-033555 U   | 2/1987  |
| JP | 04-008123 U   | 1/1992  |
| JP | 2004-326440 A | 11/2004 |

OTHER PUBLICATIONS

International Search Report for corresponding Application No. PCT/JP2018/005676, dated Apr. 10, 2018.

*Primary Examiner* — Rockshana D Chowdhury
(74) *Attorney, Agent, or Firm* — Renner, Otto, Boisselle & Sklar, LLP

(57) ABSTRACT

An electronic device includes a first unit, a second unit, and a lock mechanism. The lock mechanism includes: an engagement projection provided on a third side surface of the first unit; a latch provided on a fourth side surface of the second unit, the latch being rotatable around a rotation axis provided perpendicular to the fourth side surface between a first rotational position where the latch does not engage with the engagement projection and a second rotational position where the latch is engageable with the engagement projection, and an urging member that urges the latch to be positioned at the second rotational position. The latch has an inclined part. When the latch is located at the second rotational position and the first unit is changed to a closed state from a state where the first unit is not closed, the inclined part abuts on the engagement projection during the change.

4 Claims, 9 Drawing Sheets

(51) Int. Cl.
   *E05B 63/24*     (2006.01)
   *E05B 65/00*     (2006.01)
   *H05K 5/03*      (2006.01)

(56) References Cited

U.S. PATENT DOCUMENTS

| | | | |
|---|---|---|---|
| 7,427,087 B2* | 9/2008 | Chuang | E05C 3/06 |
| | | | 292/98 |
| 7,453,688 B2* | 11/2008 | Wu | G06F 1/1616 |
| | | | 361/679.55 |
| 8,593,807 B2* | 11/2013 | Murakata | G06F 1/1616 |
| | | | 361/679.58 |
| 2004/0259593 A1* | 12/2004 | Wang | G06F 1/1616 |
| | | | 455/556.1 |
| 2005/0036284 A1* | 2/2005 | Kang | G06F 1/162 |
| | | | 361/679.58 |

* cited by examiner

ELECTRONIC DEVICE

BACKGROUND

1. Technical Field

The present disclosure relates to an electronic device having a lock mechanism that locks a first unit in a second unit.

2. Description of the Related Art

PTL 1 discloses an information processing device having a lock mechanism that locks a body unit and a display unit coupled to each other via hinges in a closed state.

Here, PTL 1 is Unexamined Japanese Patent Publication No. 2004-326440.

SUMMARY

In an information processing device of PTL 1, a mechanism part in the display unit needs to be rotatable. Further, it is necessary to provide, in the body unit, an engagement mechanism that engages projection pieces of a mechanism in the display unit. Furthermore, this engagement mechanism has many parts such as a plurality of springs, a plurality of lock pawls, and a lock case, and has a complicated structure.

The present disclosure provides an electronic device having a lock mechanism that has a small number of parts and a simple structure.

An electronic device according to one aspect of the present disclosure includes: a first unit including a first electronic component and having a first principal surface, a first side surface being perpendicular to the first principal surface, and a third side surface other than the first side surface; a second unit including a second electronic component and having a second principal surface, a second side surface being perpendicular to the second principal surface, and a fourth side surface other than the second side surface; a hinge that couples the first side surface of the first unit and the second side surface of the second unit directly or via a support member allowing the first unit and the second unit to be relatively rotatable; and a lock mechanism that locks the first unit in the second unit with the first unit being in a closed state where the first unit facing the second unit.

The lock mechanism includes: an engagement projection provided on the third side surface of the first unit; a latch provided on the fourth side surface of the second unit, the latch being rotatable around a rotation axis provided perpendicular to the fourth side surface between a first rotational position where the latch does not engage with the engagement projection and a second rotational position where the latch is engageable with the engagement projection, and an urging member that urges the latch to be positioned at the second rotational position.

The latch has an inclined part. When the latch is located at the second rotational position and the first unit is changed to the closed state from a state where the first unit is not closed, the inclined part abuts on the engagement projection of the first unit during the change.

The inclined part is inclined so as to rotate the latch toward the first rotational position when the engagement projection abuts on the inclined part.

With the technique of the present disclosure, a number of parts is reduced, and a structure is simplified. As a result, strength of the parts themselves can be improved, and solidity can be enhanced.

DETAILED DESCRIPTION

Exemplary embodiments will be described in detail below, as appropriate, with reference to the accompanying drawings. However, more detailed description than necessary may be omitted in some cases. For example, a detailed description of a well-known matter and a duplicated description of substantially the same configuration will be omitted in some cases. A reason for this is to avoid unnecessary redundancy of the following description and to facilitate understanding of those skilled in the art.

Here, the inventor of the present disclosure provides the accompanying drawings and the following description such that those skilled in the art can sufficiently understand the present disclosure, and therefore, does not intend to restrict the subject matters of claims by the accompanying drawings and the following description.

First Exemplary Embodiment

A first exemplary embodiment will be described below with reference to the drawings.

[1. Configuration]

[1-1. Outline]

Figure 1:
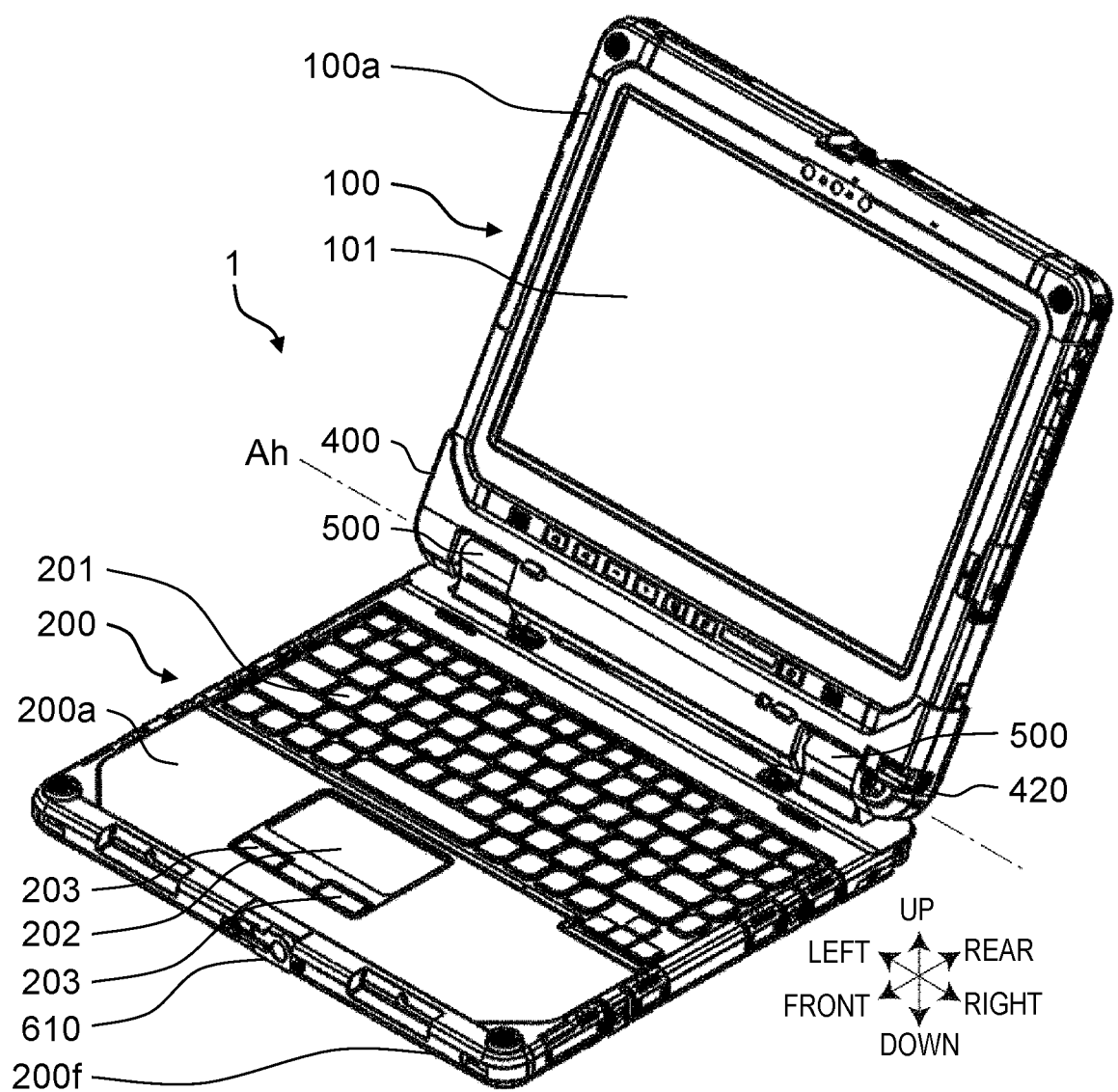
FIG. 1 is a perspective view of a computer according to a first exemplary embodiment and illustrates a state in which a tablet unit is opened.
Figure 2:
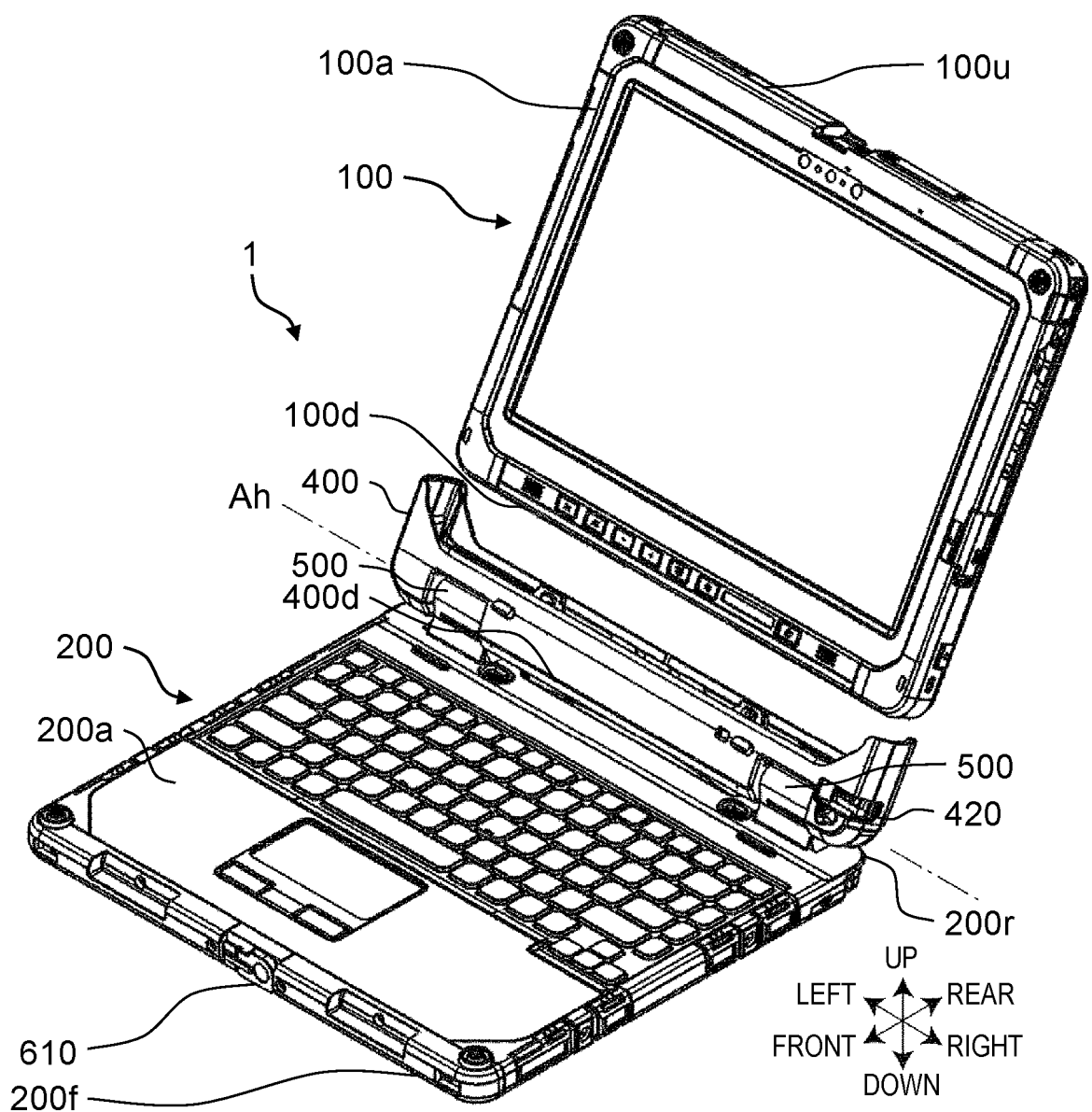
FIG. 2 is a perspective view of the computer and illustrates a state in which the tablet unit is detached.
Figure 3:
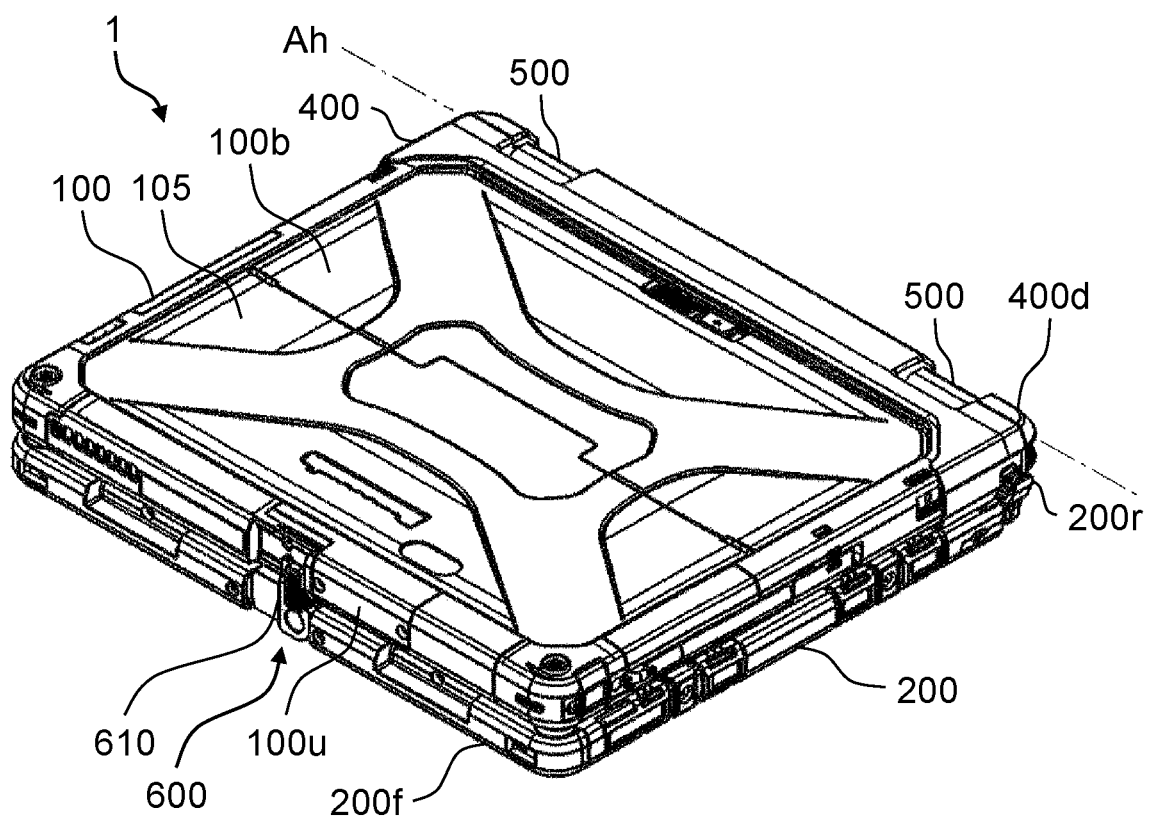
FIG. 3 is a perspective view of the computer and illustrates a state in which the tablet unit is closed.

FIGS. 1, 2, and 3 are perspective views of a computer according to the first exemplary embodiment. FIG. 1 illustrates a state in which tablet unit 100 is attached to keyboard unit 200. FIG. 2 illustrates a state in which tablet unit 100 is detached from keyboard unit 200. FIG. 3 illustrates a state in which tablet unit 100 is closed. In the drawings, directions are given as appropriate for convenience for the purpose of explanation and easier understanding. The directions are based on directions viewed by a user when computer 1 is utilized in a general utilization mode, but it is not intended that computer 1 should be used and disposed in these directions. In FIGS. 1 and 2, a left-right direction corresponds to a device width direction of tablet unit 100 and keyboard unit 200. Further, an up-down direction substantially corresponds to a device depth direction of tablet unit 100 and corresponds to a device thickness direction of keyboard unit 200. Further, a front-rear direction substantially corresponds to a device thickness direction of tablet unit 100 and corresponds to a device depth direction of keyboard unit 200.

Computer 1 has tablet unit 100 and keyboard unit 200. Computer 1 is an example of an electronic device. Tablet unit 100 is an example of a first unit. Keyboard unit 200 is an example of a second unit.

Tablet unit 100 includes display 101 on front surface 100$a$ (first principal surface). Display 101 is composed of, for example, a liquid crystal display panel. Further, display 101 has a touch panel capable of receiving touch operation by a user. Various electronic components such as a central processing unit (CPU), a volatile storage device (RAM), a non-volatile storage device (e.g., ROM and SSD), and a communication module are contained in tablet unit 100. These electronic components are examples of first electronic components. Furthermore, a detachable battery that supplies electric power to these electronic components is contained in tablet unit 100. Openable cover 105 is provided on rear surface 100$b$ of tablet unit 100 (see FIG. 3), and the battery can be detached by opening cover 105. In the nonvolatile storage device (such as the ROM and the SSD), an operating system (OS), various application programs, various data, and the like are stored. The central processing unit (CPU) reads the OS, the application programs, and the various data and performs arithmetic processing to achieve various functions in computer 1.

A housing of tablet unit 100 is made of, for example, resin or metal such as a magnesium alloy.

Keyboard unit 200 includes holder 400 and hinges 500.

Keyboard unit 200 includes keyboard 201, touch pad 202, operation buttons 203, and the like on upper surface 200$a$ (second principal surface). Further, keyboard unit 200 has an interface for transmitting and receiving data to and from tablet unit 100 and an external device interface for connection with an external device. Various electronic components such as a keyboard controller and a touch pad controller are contained in keyboard unit 200. These electronic components are examples of second electronic components.

A housing of keyboard unit 200 is made of, for example, resin or metal such as a magnesium alloy.

As illustrated in FIG. 2, holder 400 is coupled to side surface 200$r$ on a rear side of keyboard unit 200 (hereinafter referred to as "rear side surface 200$r$" as appropriate) via hinges 500. As illustrated in FIG. 1, holder 400 can attach tablet unit 100. Further, as illustrated in FIG. 2, holder 400 can detach tablet unit 100 by operating operation lever 420.

Hinges 500 couple rear side surface 200$r$ of keyboard unit 200 and side surface 400$d$ on a lower side of holder 400 (hereinafter referred to as "lower side surface 400$d$" as appropriate) such that keyboard unit 200 and holder 400 are relatively rotatable around rotation axis Ah. Rotation axis Ah, around which keyboard unit 200 and holder 400 are relatively rotatable, is parallel to a device width direction (left-right direction in FIG. 1) of computer 1. Note that this also means that hinges 500 couple rear side surface 200$r$ of keyboard unit 200 and side surface 100$d$ on a lower side of tablet unit 100 attached to holder 400 (hereinafter referred to as "lower side surface 100$d$" as appropriate) such that keyboard unit 200 and tablet unit 100 are relatively rotatable around rotation axis Ah. For example, as illustrated in FIG. 1, hinges 500 can allow tablet unit 100 to be opened at an angle of about 100 degrees with respect to keyboard unit 200. Also, as illustrated in FIG. 3, hinges 500 can allow tablet unit 100 to be closed with respect to keyboard unit 200. In the closed state, front surface 100$a$ of tablet unit 100 and upper surface 200$a$ of keyboard unit 200 closely face and are substantially parallel to each other.

Holder 400 is provided with a connector (not illustrated) that is connected with a connector (not illustrated) of tablet unit 100 with tablet unit 100 attached to holder 400. Various signals and electric power are given and received between tablet unit 100 and keyboard unit 200 via these connectors. For example, signals output from keyboard 201, touch pad 202, the plurality of operation buttons 203, and the like, of keyboard unit 200 can be output to tablet unit 100. Tablet unit 100 can receive these signals and perform control based on the received signals. Therefore, computer 1 can be utilized as a notebook type computer by attaching tablet unit 100 to keyboard unit 200. Further, tablet unit 100 can be utilized alone as a tablet type computer.

[1-2. Lock Mechanism]

As illustrated in FIG. 3, computer 1 is provided with lock mechanism 600 that locks tablet unit 100 in keyboard unit 200 with tablet unit 100 closed by facing keyboard unit 200. Lock mechanism 600 will be described below.

Figure 4A:
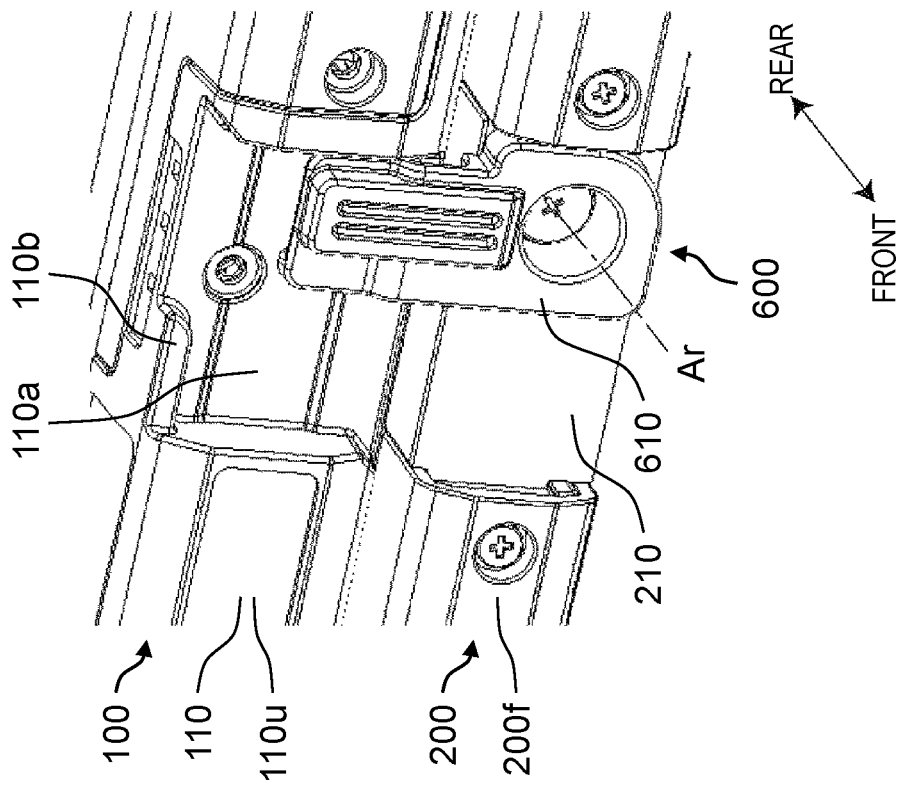
FIG. 4A is a perspective view illustrating a state in which a portion of a lock mechanism of the computer is viewed from a front and diagonally above and illustrates a state in which a latch is located at a first rotational position.
Figure 4B:
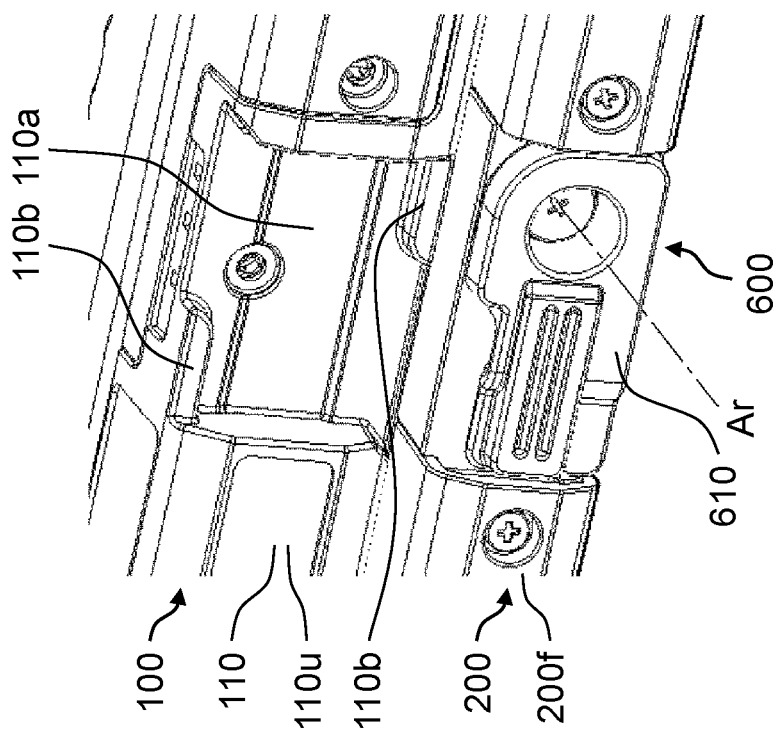
FIG. 4B is a perspective view illustrating a state in which the portion of the lock mechanism of the computer is viewed from the front and diagonally above and illustrates a state in which the latch is located at a second rotational position.

FIGS. 4A and 4B are perspective views each illustrating a state in which a portion of the lock mechanism of computer 1 is viewed from a front and diagonally above.

Lock mechanism 600 has latch 610 and engagement projections 110$b$. Keyboard unit 200 has side surface 200$f$ on a front side of housing 210 (hereinafter referred to as "front side surface 200$f$" as appropriate). Latch 610 is provided on front side surface 200$f$ to be rotatable around rotation axis Ar perpendicular to front side surface 200$f$. Tablet unit 100 has step-down part 110$a$ on side surface 100$u$ on an upper side of housing 110 (hereinafter referred to as "upper side surface 100$u$" as appropriate). Engagement projections 110$b$ are provided at step-down part 110$a$ on upper side surface 100$u$. Engagement projections 110$b$ each have a rib shape extending in the left-right direction (device width direction). Latch 610 is rotatable between a first rotational position illustrated in FIG. 4A where latch 610 does not engage with engagement projection 110$b$ and a second rotational position illustrated in FIG. 4B where latch 610 engages with engagement projection 110$b$. At the first rotational position, latch 610 is parallel to a longitudinal direction (left-right direction) of front side surface 200*f* and fits within an up-down range of front side surface 200*f*.

In computer 1, tablet unit 100 can be attached to holder 400 not only in a state in which front surface 100*a* of tablet unit 100 is on a front side as illustrated in FIG. 1, but also in a state in which rear surface 100*b* of tablet unit 100 is on the front side (a turned-over state). Accordingly, computer 1 is provided with engagement projections 110*b* at two places such that tablet unit 100 can be locked in the turned-over state.

FIG. 4A illustrates a state in which tablet unit 100 is closed and latch 610 is located at the first rotational position. At this time, by rotating latch 610 to the second rotational position, latch 610 and engagement projection 110*b* are engaged with each other, and tablet unit 100 can be locked in keyboard unit 200.

Herein, even when tablet unit 100 is closed in a state in which tablet unit 100 is opened and latch 610 is located at the second rotational position, computer 1 of the present exemplary embodiment has a configuration that prevents breakage of latch 610. Specifically, in a process of closing tablet unit 100, engagement projection 110*b* abuts on inclined rib 610*g* (see FIG. 5B) of latch 610 and rotates latch 610 toward the first rotational position. The configuration will be described in detail below.

Figure 5A:
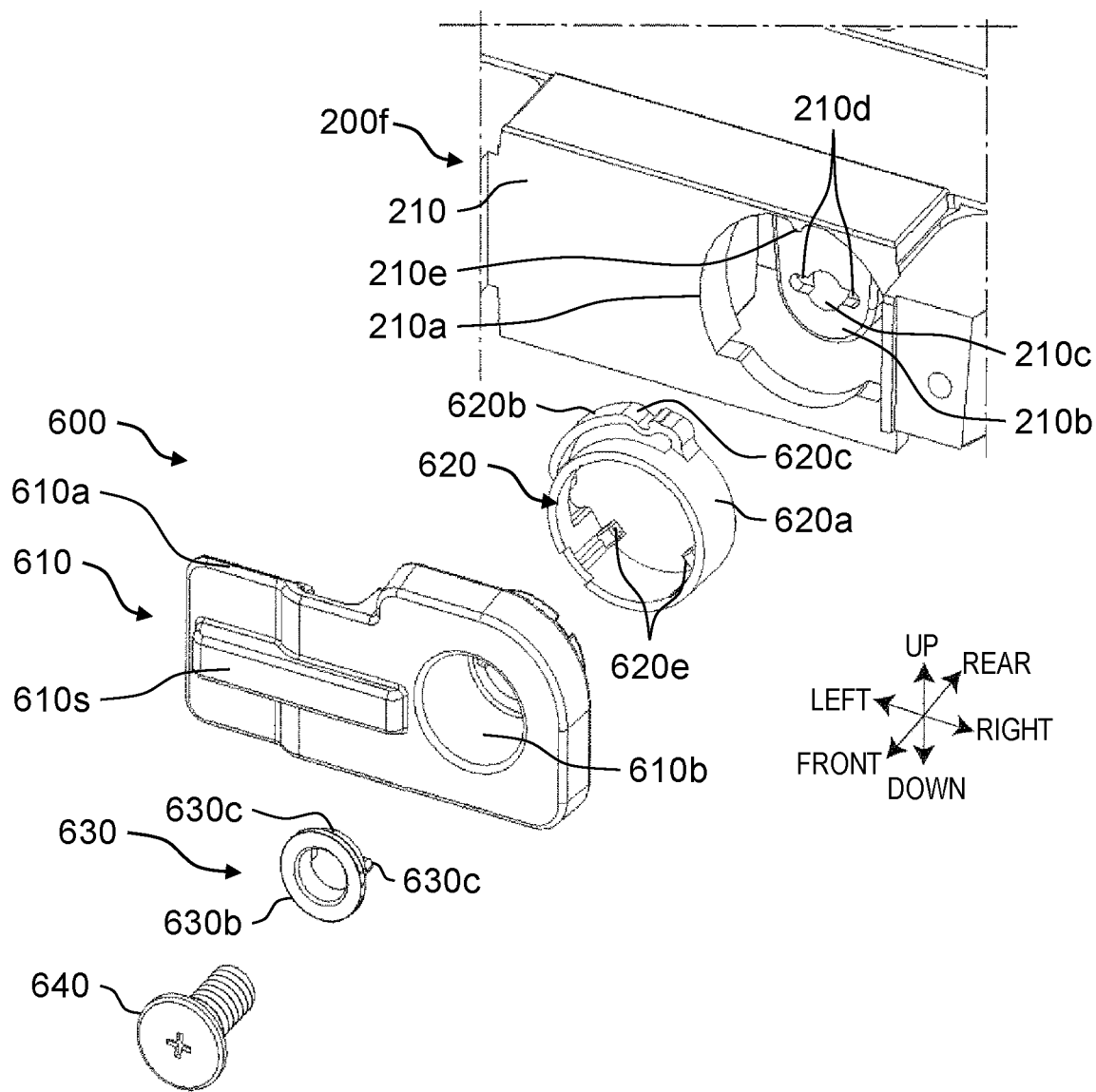
FIG. 5A is an exploded perspective view illustrating a state in which the lock mechanism is disassembled and viewed from the front and diagonally above.
Figure 5B:
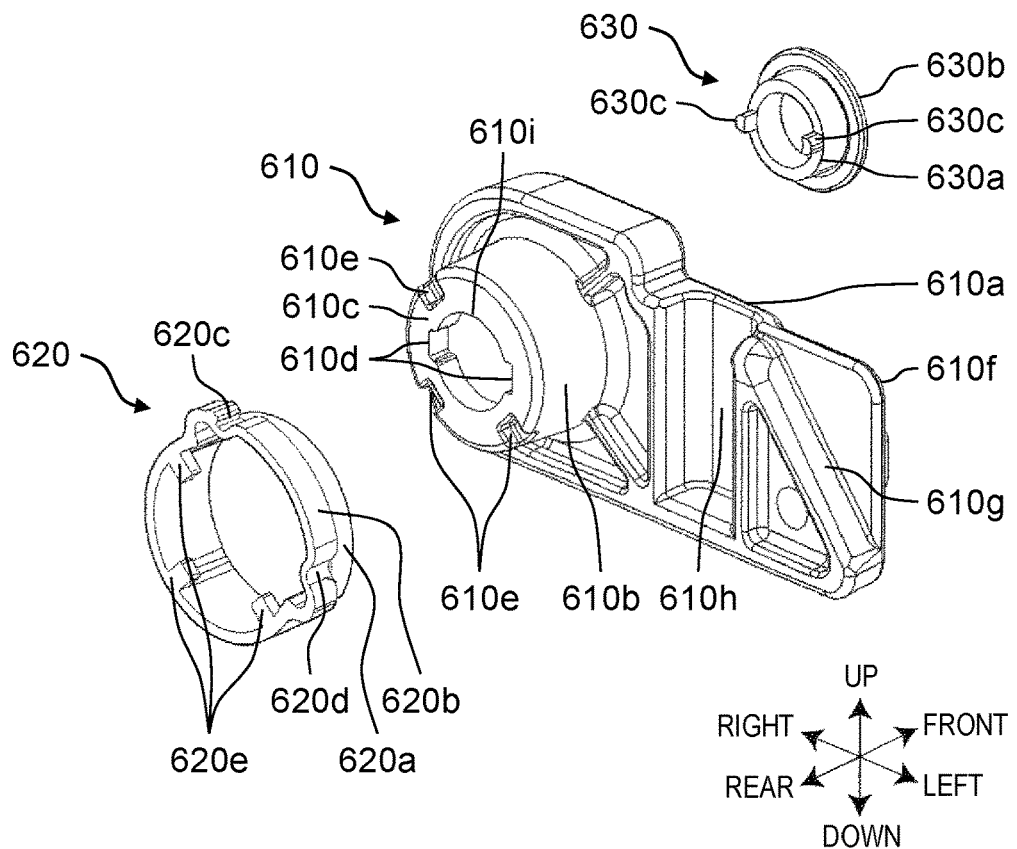
FIG. 5B is an exploded perspective view illustrating a state in which the lock mechanism is disassembled and viewed from a rear surface side and diagonally above.

FIG. 5A is an exploded perspective view illustrating a state in which lock mechanism 600 is disassembled and viewed from a front and diagonally above. FIG. 5B is an exploded perspective view illustrating a state in which lock mechanism 600 is disassembled and viewed from a rear surface side and diagonally above.

In addition to latch 610 described above, lock mechanism 600 has resin spring 620, resin ring 630, and screw 640.

Latch 610 is made of a magnesium alloy, and has main body 610*a*, protrusion 610*s* for operation, cylinder 610*b*, and annular bottom surface 610*c*. Main body 610*a* has a rectangular plate shape. Protrusion 610*s* for operation is provided on a front surface of main body 610*a*. Cylinder 610*b* is provided by penetrating a base end of main body 610*a*. Annular bottom surface 610*c* is provided on a tip of cylinder 610*b* and has through-hole 610*i*. A pair of cut-outs 610*d* is provided on a periphery of through-hole 610*i* of annular bottom surface 610*c*. Further, a plurality of recesses 610*e* is provided on an outer periphery of annular bottom surface 610*c*. A plurality of ribs for reinforcement is provided on a rear surface of main body 610*a*. Among the ribs, rib 610*g* on free end 610*f* is inclined with respect to a longitudinal direction of latch 610 (hereinafter referred to as "inclined rib 610*g*"). Further, on the rear surface near a middle in the longitudinal direction of latch 610, engagement recess 610*h* extending in a direction orthogonal to the longitudinal direction is provided.

Resin spring 620 is made of resin and elastic, and has cylinder 620*a*, spring part 620*b*, first recess 620*c*, and second recess 620*d*. Spring 620*b* protrudes radially outward at a rear end of cylinder 620*a*. First recess 620*c* and second recess 620*d* are each recessed toward an inner periphery near each end in a circumferential direction of spring 620*b*. Further, a plurality of projections 620*e* protruding radially inward is provided at the rear end of cylinder 620*a*.

Resin ring 630 is made of resin and has cylinder 630*a*, large-diameter ring part 630*b*, and projections 630*c*. Large-diameter part 630*b* is provided at a front end of cylinder 630*a* and has a diameter larger than a diameter of cylinder 630*a*. Projections 630*c* protrude rearward from a rear end of cylinder 630*a*.

Figure 5C:
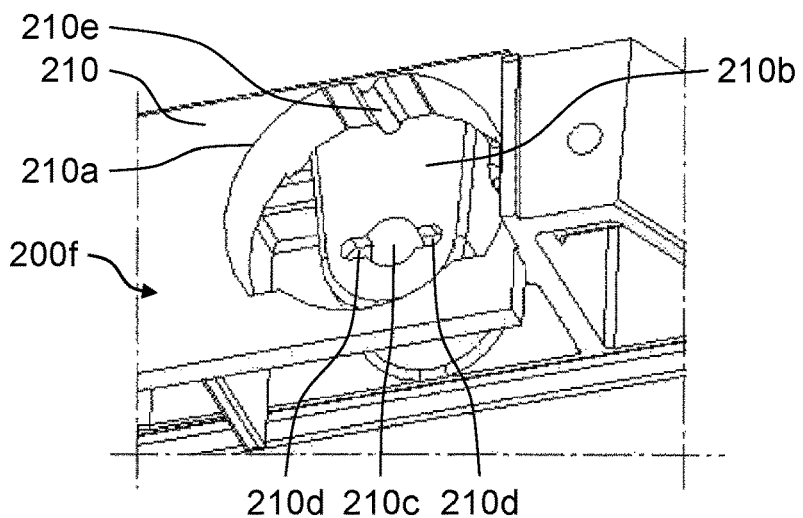
FIG. 5C is a perspective view of a latch disposition portion of a keyboard unit viewed from the front and diagonally below.
Figure 5C:
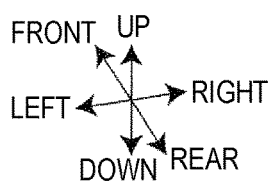

FIG. 5C is a perspective view of a latch disposition portion of keyboard unit 200 viewed from a front and diagonally below. As illustrated in FIGS. 5A and 5C, latch mounting hole 210*a* is provided on front side surface 200*f* of keyboard unit 200 (housing 210). Latch mount 210*b* is provided at a rear of latch mounting hole 210*a*. Screw hole 210*c*, into which screw 640 is screwed, and recesses 210*d* provided on sides of screw hole 210*c* are provided on a front surface of latch mount 210*b*. Positioning projection 210*e* protruding radially inward is provided at an upper part of an inner circumference of latch mounting hole 210*a*.

Figure 6A:
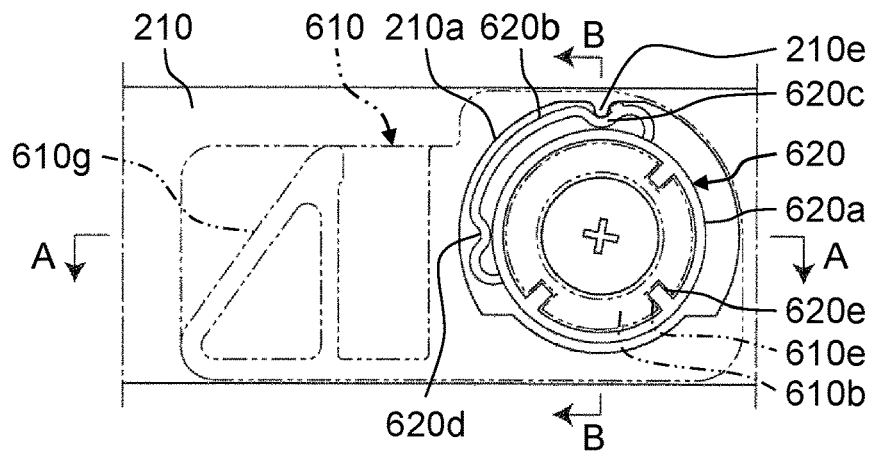
FIG. 6A is a view for explaining urging of a resin spring to the latch when the latch is located at the first rotational position.
Figure 6B:
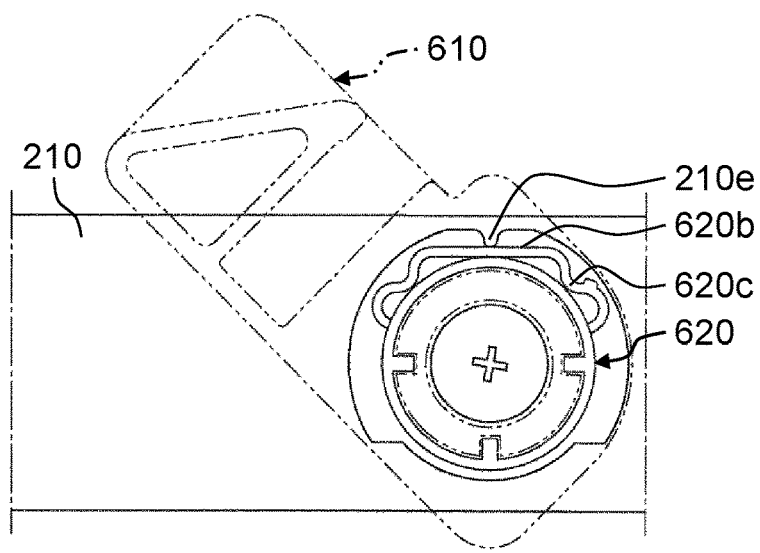
FIG. 6B is a view for explaining urging of the resin spring to the latch when the latch is located at an intermediate position between the first rotational position and the second rotational position.
Figure 6C:
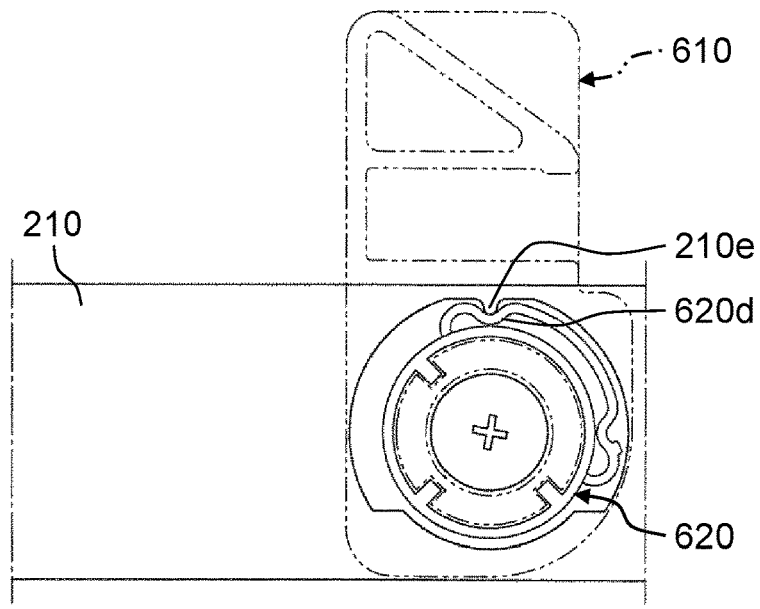
FIG. 6C is a view for explaining urging of the resin spring to the latch when the latch is located at the second rotational position.
Figure 7A:
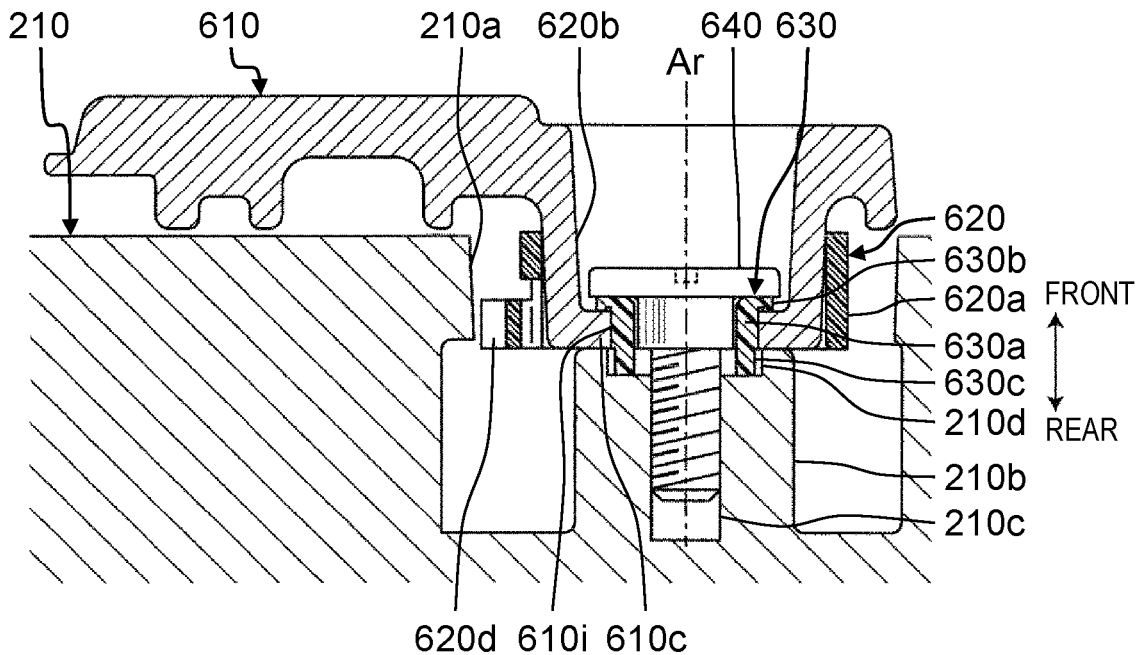
FIG. 7A is a sectional view taken along line A-A in FIG. 6A.

FIGS. 6A, 6B, and 6C are front views of the portion of the lock mechanism. FIG. 6A illustrates the portion when latch 610 is located at the first rotational position, FIG. 6B illustrates the portion when latch 610 is located at an intermediate position between the first rotational position and the second rotational position, and FIG. 6C illustrates the portion when latch 610 is located at the second rotational position. Note that latch 610 is made transparent and indicated by a two-dot chain line. FIG. 7A illustrates a cross section taken along line A-A in FIG. 6A, and FIG. 7B illustrates a cross section taken along line B-B in FIG. 6A.

Figure 7B:
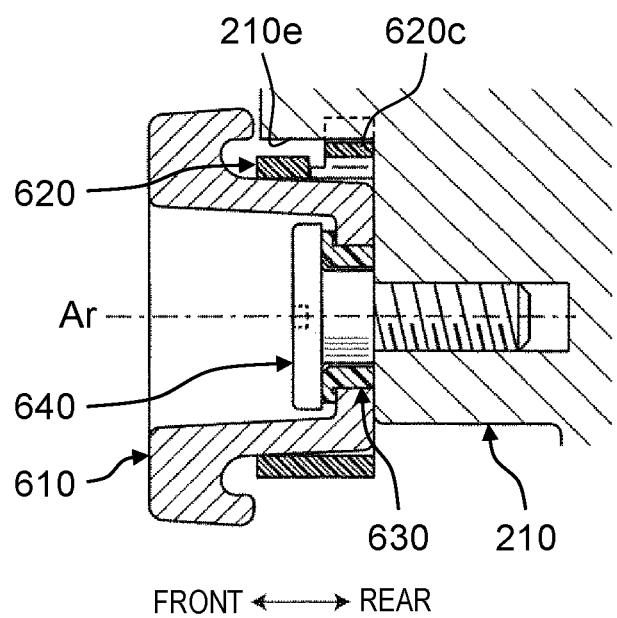
FIG. 7B is a sectional view taken along line B-B in FIG. 6A.

As illustrated in FIGS. 6A, 7A, and 7B, cylinder 610*b* of latch 610 is fitted in latch mounting hole 210*a* of housing 210 of keyboard unit 200. A rear surface of annular bottom surface 610*c* slidably abuts on the front surface of latch mount 210*b* of housing 210. Cylinder 630*a* of resin ring 630 fits in through-hole 610*i* of annular bottom surface 610*c*. The rear end of cylinder 630*a* abuts on the front surface of latch mount 210*b*. Further, projections 630*c* at a rear end of resin ring 630 fit in recesses 210*d* of latch mount 210*b*. Accordingly, resin ring 630 cannot relatively rotate to latch mount 210*b*. Large-diameter ring 630*b* at the front end of resin ring 630 is located on a front surface of annular bottom surface 610*c*. Screw 640 is screwed into screw hole 210*c* of latch mount 210*b* through resin ring 630. A bearing surface of screw 640 abuts on large-diameter ring 630*b* with screw 640 is screwed at fixed torque. Resin ring 630 is made of a material easily slidable against a material of latch 610. Accordingly, latch 610 rotates while sliding against resin ring 630 during the rotation. Also, at this time, rotating force of latch 610 is not transmitted to screw 640 by existence of resin ring 630. As a result, loosening of screw 640 by the rotation of latch 610 can be prevented.

Resin spring 620 is disposed coaxially with cylinder 610*b* of latch 610 and is fitted in cylinder 610*b* from a rear end of latch 610. At this time, projections 620*e* of resin spring 620 fit in recesses 610*e* of latch 610 (see FIG. 5B). Accordingly, resin spring 620 cannot relatively rotate to latch 610 and rotates interlocking with the rotation of latch 610.

When latch 610 is located at the first rotational position as illustrated in FIGS. 6A, 7A, and 7B, positioning projection 210*e* of housing 210 fits in first recess 620*c* of resin spring 620. As a result, latch 610 does not rotate by urging force of resin spring 620, unless rotating force of more than or equal to a fixed value is applied to latch 610.

When latch 610 is located at the first rotational position and clockwise rotating force of more than or equal to the fixed value is applied, due to deformation of spring 620*b* of resin spring 620, positioning projection 210*e* escapes from first recess 620*c* as illustrated in FIG. 6B, and latch 610 can be rotated clockwise. FIG. 6B illustrates a state in which latch 610 is rotated clockwise by about 45 degrees. In this state, a vicinity of a circumferential center of spring 620*b* is deflected radially inward. Accordingly, pressing force is applied from spring 620*b* to positioning projection 210*e*, and latch 610 is held at this rotational position.

When latch 610 is located at the second rotational position as illustrated in FIGS. 6C, positioning projection 210e of housing 210 fits in second recess 620d of resin spring 620. As a result, latch 610 does not rotate by urging force of resin spring 620, unless rotating force of more than or equal to a fixed value is applied to latch 610.

Figure 8A:
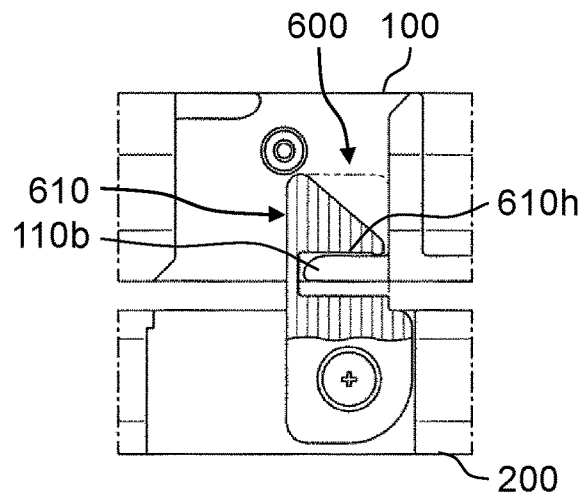
FIG. 8A is an operation description view of the lock mechanism.

FIGS. 8A, 8B, 8C, and 8D are operation description views of lock mechanism 600. In each of FIGS. 8A to 8D, a part of latch 610 is ruptured and an outline of the part is indicated by a two-dot chain line to facilitate understanding of the operation. FIG. 8A illustrates a state in which tablet unit 100 is closed and latch 610 is located at the second rotational position. At this time, engagement projection 110b of tablet unit 100 can fit in engagement recess 610h of latch 610. Further, at this time, resin spring 620 urges latch 610 to be positioned at the second rotational position. Thereby, tablet unit 100 cannot be opened. Also, unexpected opening of tablet unit 100 to keyboard unit 200 is restricted.

In the state illustrated in FIG. 8A, by applying counterclockwise rotating force of more than or equal to the fixed value is applied to latch 610, latch 610 can be rotated counterclockwise and positioned at the first rotational position.

Figure 8B:
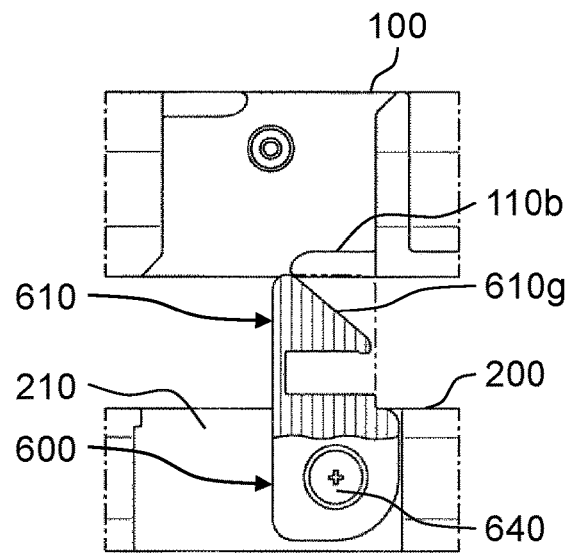
FIG. 8B is an operation description view of the lock mechanism.
Figure 8C:
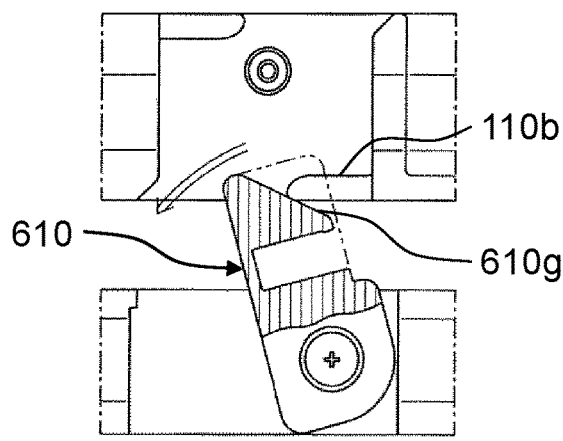
FIG. 8C is an operation description view of the lock mechanism.
Figure 8D:
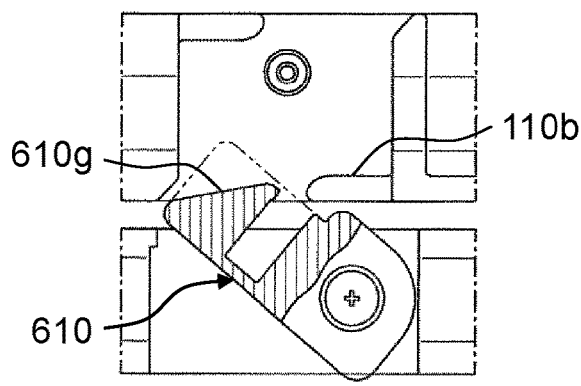
FIG. 8D is an operation description view of the lock mechanism.

FIG. 8B illustrates a state in which tablet unit 100 is opened and latch 610 is located at the second rotational position. At this time, for example, when tablet unit 100 is closed through user's carelessness, engagement projection 110b abuts on inclined rib 610g of latch 610 in a closing process. At this time, downward force acts on inclined rib 610g of latch 610 from engagement projection 110b. Since an abutted portion is inclined, this downward force is converted into force to rotate latch 610 toward the first rotational position. Accordingly, when tablet unit 100 continues to be closed, latch 610 rotates as illustrated in FIGS. 8C and 8D. FIG. 8D illustrates latch 610 when tablet unit 100 is closed. Thus, in lock mechanism 600 of the present exemplary embodiment, even if tablet unit 100 is closed when tablet unit 100 is opened and latch 610 is located at the second rotational position, breakage of latch 610 can be prevented.

On the other hand, assuming that latch 610 is not provided with inclined rib 610g, when engagement projection 110b of tablet unit 100 abuts on an upper side of latch 610 (an upper side indicated by the two-dot chain line) as illustrated in FIG. 8B, downward force applies to latch 610 from engagement projection 110b, and is transmitted almost as it is to screw 640 that functions as a rotation shaft as force to move screw 640 downward. However, since one end of screw 640 is screwed to housing 210, the force becomes force to bend screw 640, and lock mechanism 600 may be broken. However, in the present exemplary embodiment, the breakage described above can be prevented by providing inclined rib 610g at latch 610.

Further, in the aforementioned patent literature, lock mechanism has a large number of parts and a complicated structure. However, in lock mechanism 600 of the present exemplary embodiment, minimum members necessary for locking are only latch 610, resin spring 620, and screw 640 besides the housing. Resin ring 630 is provided for improving rotation of latch 610 and suppressing looseness of screw 640. Therefore, lock mechanism 600 having a small number of parts and a simple structure can be realized. Further, strength of the parts themselves can be improved, and solidity can be enhanced.

[2. Effects and Other Benefits]

Computer 1 (an example of an electronic device) of the present exemplary embodiment includes tablet unit 100 (an example of a first unit), keyboard unit 200 (an example of a second unit), hinges 500, and lock mechanism 600.

Tablet unit 100 includes first electronic components and has front surface 100a (a first principal surface), lower side surface 100d (a first side surface) perpendicular to front surface 100a (the first principal surface), and upper side surface 100u (a third side surface) other than lower side surface 100d (the first side surface).

Keyboard unit 200 includes second electronic components and has upper surface 200a (a second principal surface), rear side surface 200r (a second side surface) perpendicular to upper surface 200a, and front side surface 200f (a fourth side surface) other than rear side surface 200r (the second side surface).

Hinges 500 couple lower side surface 100d (the first side surface) of tablet unit 100 and rear side surface 200r (the second side surface) of keyboard unit 200 via holder 400 (a support member) such that tablet unit 100 and keyboard unit 200 are relatively rotatable.

Lock mechanism 600 locks tablet unit 100 in keyboard unit 200 with tablet unit 100 closed by facing keyboard unit 200.

Lock mechanism 600 includes engagement projections 110b, latch 610, and resin spring 620 (an urging member).

Engagement projections 110b are provided on upper side surface 100u (the third side surface) of tablet unit 100.

Latch 610 is provided on front side surface 200f (the fourth side surface) of keyboard unit 200. Latch 610 is rotatable around rotation axis Ar provided perpendicular to front side surface 200f between a first rotational position where latch 610 does not engage with engagement projection 110b and a second rotational position where latch 610 is engageable with engagement projection 110b.

Resin spring 620 urges latch 610 to be positioned at the second rotational position.

Latch 610 has inclined rib 610g (an inclined part). When tablet unit 100 is closed in a state in which latch 610 is located at the second rotational position and tablet unit 100 is not closed, inclined rib 610g (the inclined part) abuts on engagement projection 110b of tablet unit 100 in a process of closing tablet unit 100.

Inclined rib 610g (the inclined part) is inclined so as to rotate latch 610 toward the first rotational position when engagement projection 110b abuts on inclined rib 610g (the inclined part).

Accordingly, a number of parts is reduced, and a structure is simplified. As a result, strength of the parts themselves can be improved, and solidity can be enhanced.

In the present exemplary embodiment, latch 610 has a surface facing keyboard unit 200 and a rib protruding from this surface toward keyboard unit 200. Inclined rib 610g (the inclined part) is constituted of this rib.

Accordingly, when engagement projection 110b of tablet unit 100 abuts on inclined rib 610g of latch 610, even when a scratch is caused on inclined rib 610g, the scratch is hardly visually recognized from an outside. Therefore, appearance of tablet unit 100 can be kept while employing the abutting configuration. Further, the inclined part can be configured by utilizing the rib for reinforcing latch 610.

Other Exemplary Embodiments

The first exemplary embodiment has been described above as an example of the technique disclosed in the present disclosure. However, the technique of the present disclosure is not limited to the first exemplary embodiment, and also applicable to other exemplary embodiments that undergo some modifications, replacements, additions, and omissions, for example, as appropriate. In addition, new embodiments can also be achieved by combining the respective components described in the first exemplary embodiment. Thus, other exemplary embodiments will be described below as examples.

(1) In the above exemplary embodiment, a case where the electronic device according to the present disclosure is applied to a detachable type computer configured such that tablet unit 100 (an example of a first unit) and keyboard unit 200 (an example of a second unit) are detachable has been described. However, the electronic device according to the present disclosure is also applicable to an ordinary undetachable notebook type computer in which a first unit and a second unit are directly coupled by hinges so as to be relatively rotatable.

(2) In the above exemplary embodiment, inclined rib 610g has a substantially linear inclination. However, in the present disclosure, for example, the inclined part may have a shape inclined as a whole while being gently curved.

(3) In the above exemplary embodiment, a case where lock mechanism 600 is provided on upper side surface 100u of tablet unit 100 (an example of a first unit) and front side surface 200f of keyboard unit 200 (an example of a second unit) has been described. However, the lock mechanism of the present disclosure may be provided on a left side surface or a right side surface. Alternatively, the lock mechanism may be provided on any two or more side surfaces of the side surfaces other than the rear side surface.

(4) In the above exemplary embodiment, lock mechanism 600 has resin ring 630. However, the resin ring is not essential in the present disclosure.

(5) In the above exemplary embodiment, inclined rib 610g is constituted of the rib provided on the rear surface of latch 610. However, in the present disclosure, the inclined part may be constituted by having a shape in which an end on the free end of the latch itself is inclined.

The exemplary embodiments have been described above as examples of the technique in the present disclosure. For that purpose, the accompanying drawings and the detailed description have been provided. The components illustrated in the accompanying drawings and described in the detailed description may include components essential for solving the problems, as well as components that are not essential for solving the problems but required to exemplify the above techniques. Therefore, it should not be immediately construed that these components that are not essential are essential just because the components are described in the accompanying drawings and the detailed description. Since the above-described exemplary embodiments are for exemplifying the technique of the present disclosure, various modifications, replacements, additions, and omissions can be made within the scope of the claims or their equivalents.

INDUSTRIAL APPLICABILITY

The present disclosure is widely applicable to an electronic device having a lock mechanism that locks a first unit in a second unit.

What is claimed is:

1. An electronic device comprising:
a first unit including a first electronic component and having a first principal surface, a first side surface being perpendicular to the first principal surface, and a third side surface other than the first side surface;
a second unit including a second electronic component and having a second principal surface, a second side surface being perpendicular to the second principal surface, and a fourth side surface other than the second side surface;
a hinge that couples the first side surface of the first unit and the second side surface of the second unit directly or via a support member allowing the first unit and the second unit to be relatively rotatable; and
a lock mechanism that locks the first unit in the second unit with the first unit being in a closed state where the first unit facing the second unit,
wherein the lock mechanism includes:
an engagement projection provided on an outside of the third side surface of the first unit, a latch provided on an outside of the fourth side surface of the second unit so as to be directly rotatable by a user around a rotation axis extending perpendicular to the fourth side surface between a first rotational position where the latch does not engage with the engagement projection and a second rotational position where the latch is engageable with the engagement projection, and
an urging member that urges the latch to be positioned at the second rotational position,
the latch has an inclined part, and when the latch is located at the second rotational position and the first unit is changed to the closed state from a state where the first unit is not closed, the inclined part abuts the engagement projection of the first unit during the change, and
the inclined part is inclined so as to rotate the latch toward the first rotational position when the engagement projection abuts on the inclined part.

2. The electronic device according to claim 1, wherein the latch has a surface facing the second unit and a rib protruding from the surface toward the second unit, and the inclined part is constituted of the rib.

3. The electronic device according to claim 1, wherein the first principal surface includes a display and wherein the second principal surface opposes the first principal surface with the first unit being in the closed state.

4. The electronic device according to claim 1, wherein the second principal surface includes a keyboard.

* * * * *